United States Patent
Soda

(10) Patent No.: US 10,481,333 B2
(45) Date of Patent: Nov. 19, 2019

(54) ATHERMAL SILICON PHOTONICS WAVELENGTH LOCKER AND METER

(71) Applicant: MACOM Technology Solutions Holdings, Inc., Lowell, MA (US)

(72) Inventor: Haruhisa Soda, Hachioji (JP)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 15/642,589

(22) Filed: Jul. 6, 2017

(65) Prior Publication Data

US 2019/0011638 A1    Jan. 10, 2019

(51) Int. Cl.
| | |
|---|---|
| H04B 10/572 | (2013.01) |
| G02B 6/293 | (2006.01) |
| G02B 6/12 | (2006.01) |
| H04J 14/02 | (2006.01) |
| H04B 10/516 | (2013.01) |

(Continued)

(52) U.S. Cl.
CPC ..... *G02B 6/29344* (2013.01); *G02B 6/12007* (2013.01); *G02B 6/29352* (2013.01); *H04B 10/5161* (2013.01); *H04B 10/572* (2013.01); *H04J 14/02* (2013.01);

(Continued)

(58) Field of Classification Search
None
See application file for complete search history.

(56) References Cited

U.S. PATENT DOCUMENTS

| | | | | |
|---|---|---|---|---|
| 5,428,698 A | * | 6/1995 | Jenkins | G02B 6/2813 385/125 |
| 5,933,554 A | * | 8/1999 | Leuthold | G02F 1/3517 385/14 |

(Continued)

FOREIGN PATENT DOCUMENTS

GB    2368969    5/2002

OTHER PUBLICATIONS

Lindecrantz et al., Estimation of Propagation Losses for Narrow Strip and Rib Waveguides, 2014, IEEE, pp. 1836-1839.*

(Continued)

*Primary Examiner* — Kenneth N Vanderpuye
*Assistant Examiner* — Jai M Lee
(74) *Attorney, Agent, or Firm* — Thomas | Horstemeyer, LLP; Michael J. D'Aurelio; Jason M. Perilla

(57) ABSTRACT

A wavelength locker includes first and second waveguides to guide light. The wavelength locker also includes a multi-mode interference (MMI) coupler having a number of inputs and outputs. First and second inputs of the MMI coupler are coupled to outputs of the first and second waveguides. The MMI coupler merges light from the first and second waveguides to generate an interference pattern of light. The MMI coupler then outputs a plurality of phase shifted versions of the interference pattern. The wavelength locker also includes an interference pattern selector configured to receive signals corresponding, respectively, to light output from the outputs of the MMI coupler. The interference pattern selector is also configured to select one or more outputs of the MMI coupler based on power levels of the interference patterns output from the MMI coupler and a predetermined frequency of a telecommunications frequency grid.

16 Claims, 8 Drawing Sheets

(51) Int. Cl.
*H01S 5/0687* (2006.01)
*H01S 5/12* (2006.01)

(52) U.S. Cl.
CPC .. *G02B 2006/12097* (2013.01); *H01S 5/0687* (2013.01); *H01S 5/12* (2013.01)

(56) References Cited

U.S. PATENT DOCUMENTS

| | | | | |
|---|---|---|---|---|
| 6,084,992 | A * | 7/2000 | Weber | G02B 6/12007 385/16 |
| 6,222,955 | B1 * | 4/2001 | Lagali | G02B 6/12011 385/20 |
| 6,253,000 | B1 * | 6/2001 | Madsen | H04Q 11/0001 385/16 |
| 6,292,597 | B1 * | 9/2001 | Lagali | G02B 6/12011 385/1 |
| 6,788,837 | B2 * | 9/2004 | Liu | G02B 6/12007 385/131 |
| 10,056,733 | B1 * | 8/2018 | Taylor | H01S 5/005 |
| 2001/0038735 | A1 * | 11/2001 | Augustsson | G02F 1/225 385/24 |
| 2004/0042792 | A1 * | 3/2004 | Samara-Rubio | H04Q 11/0005 398/45 |
| 2009/0041407 | A1 * | 2/2009 | Silfvenius | B82Y 20/00 385/14 |
| 2010/0295083 | A1 * | 11/2010 | Celler | G02B 6/132 257/98 |
| 2015/0023382 | A1 * | 1/2015 | Schell | H01S 5/026 372/96 |
| 2015/0295672 | A1 * | 10/2015 | Okayama | H04J 14/02 398/65 |
| 2016/0127070 | A1 * | 5/2016 | Nagarajan | G02F 1/025 398/82 |
| 2016/0363835 | A1 * | 12/2016 | Nagarajan | G02F 1/2257 |
| 2017/0110850 | A1 * | 4/2017 | Li | H01S 5/021 |
| 2017/0285267 | A1 * | 10/2017 | Kato | G02B 6/274 |
| 2017/0324482 | A1 * | 11/2017 | Kato | H04B 10/677 |
| 2018/0249555 | A1 * | 8/2018 | Sugiyama | H05B 37/0227 |

OTHER PUBLICATIONS

PCT Patent Application PCT/US2018/037245 filed on Jun. 13, 2018, International Search Report and Written Opinion dated Sep. 20, 2018.

* cited by examiner

ATHERMAL SILICON PHOTONICS WAVELENGTH LOCKER AND METER

BACKGROUND

In Silicon Photonics (SiPh), optical devices can be integrated with electronic components using semiconducting materials and semiconductor manufacturing techniques. Among other uses, SiPh devices can be relied upon to communicate data between optical transmitters and receivers. In an optical transmitter, data is used to modulate light, such as that produced by a light or laser emitting diode, and the modulated light can be transmitted to an optical receiver over optical waveguides, fiber optic cables, etc. Modulated light streams (e.g., optical data streams) are more suitable for long distance, low loss data transmission as compared to data transmitted in the electrical domain.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments. In the drawings, like reference numerals designate like or corresponding, but not necessarily the same, elements throughout the several views.

DETAILED DESCRIPTION

Figure 1:
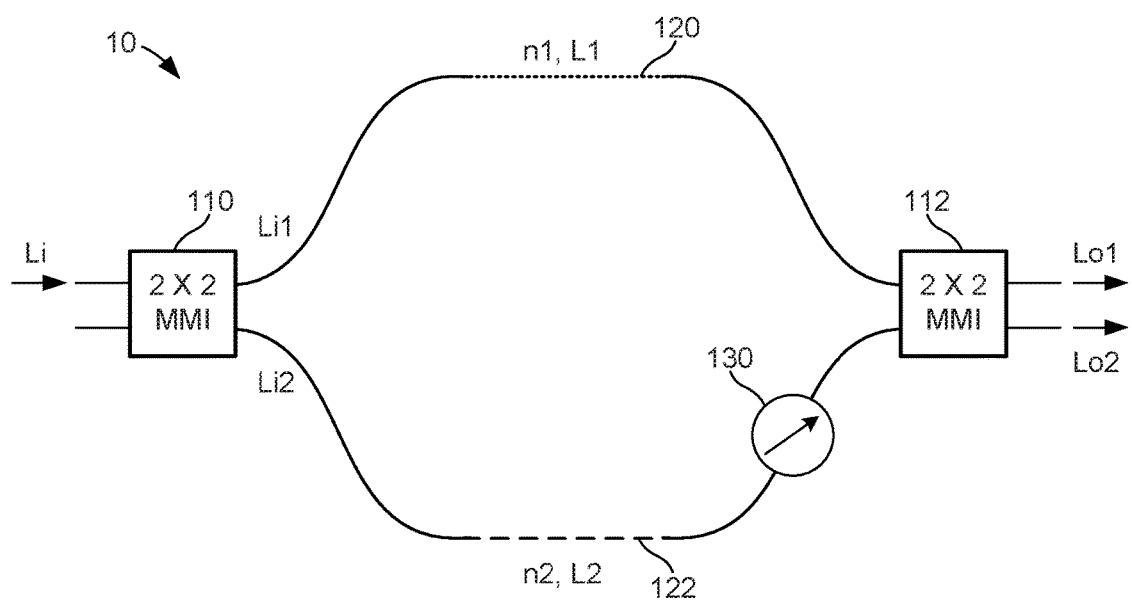
FIG. 1 illustrates an example structure suitable for use as a wavelength locker or wavelength meter according to various embodiments described herein.

In fiber-optic communications, wavelength-division multiplexing (WDM) is a technology in which a number of optical carriers of laser light are multiplexed onto a single optical fiber. As an example, WDM can use two channels, the wavelengths of 1310 and 1550, on one single-mode optical fiber for data communications.

Extensions to WDM include coarse WDM (CWDM) and dense WDM (DWDM). CDWM might use sixteen channels, and DWDM might use forty channels, for example. Thus, WDM, CWDM, and DWDM are based on the same concept of using multiple wavelengths or channels of light on a single fiber, but differ in the number and spacing of those channels. The International Telecommunication Union (ITU) has standardized a number of channel spacing grids for use with CWDM and DWDM over certain bands of wavelengths (e.g., the "C" and "L" bands, among others) and at various channel spacings. DWDM systems, in particular, rely upon stable wavelengths that do not drift over time because of the closer spacing of the channels. Relatively precise wavelength control is thus needed in laser transmitters for DWDM systems to prevent wavelength drift of even a few GHz.

A frequency grid is a table of all the central frequencies (and corresponding wavelengths) of channels allowed in a communications system. For example, for DWDM, wavelengths around 1550 nm are used, as defined by ITU-T G.694.1. The grid is defined relative to 193.1 THz and extends from 191.7 THz to 196.1 THz with 100 GHz spacing. Frequency grids are often expressed in terms of wavelength. In that context, an example frequency grid for DWDM can cover the wavelength range from 1528.77 nm to 1563.86 nm with about 0.8 nm channel spacing, but other grids have been extended and divided to cover a larger ranges.

In conventional fiber-optic communications using WDM, CWDM, and DWDM, intensity modulation (IM) or on/off keying (OOK) has been used to convey data over any given channel using pulses of light. In optical communications, IM is a form of modulation in which the optical power output of a light source is varied in accordance with some characteristic of the modulating signal, such as data values. IM has proven to be suitable for relatively low throughput, short distance optical communications. However, IM is not particularly efficient in spectrum utilization and is susceptible to fiber impairments, such as chromatic dispersion (CD) and polarization mode dispersion (PMD).

To increase the throughput and/or signal-to-noise ratio of data transfer in optical communications systems at longer distances, other modulation techniques besides IM are being considered. For example, for long distance, high bandwidth coherent optical transmissions, optical duobinary (ODB), Differential Quadrature Phase Shift Keying (DQPSK), and other modulation schemes, including higher order coherent modulation schemes, are being considered. For DQPSK and other higher order coherent modulation schemes, however, wavelength and phase control is important.

Wavelength lockers and wavelength meters can be relied upon for wavelength control when using higher order coherent modulation schemes in optical communications systems. Before (and still after) the integration of optical components in SiPh integrated circuits, bulk (e.g., discrete) components were used for wavelength lockers and wavelength meters in optical communications systems. A Fabre-Perot or etalon-based wavelength locker is an example of a widely-used device for ITU-grid channel monitoring and/or locking in DWDM systems. Such a wavelength locker has a wide capture range and good wavelength accuracy. A built-in thermistor can be used to calibrate the thermal effects in an etalon-based wavelength locker when higher wavelength accuracy is required for a narrow FSR.

As industry trends continue toward lower power, smaller size, and higher bandwidth optical communications, however, there is a need to form and integrate wavelength lockers and wavelength meters into SiPh integrated circuits. In the future, it would be desirable to integrate wavelength lockers and wavelength meters into Transmitter-Receiver Optical Subassemblies (TROSAs). Such wavelength lockers and wavelength meters should, preferably, be operable over a long period of time and range of operating temperatures without the need for costly tuning circuitry and the overhead time needed for tuning.

In the context presented above, athermal wavelength locker and meter structures suitable for integration in SiPh integrated circuits are described herein. In one embodiment, a wavelength locker includes first and second waveguides to guide light. The wavelength locker also includes a multi-mode interference (MMI) coupler having a number of inputs and outputs. First and second inputs of the MMI coupler are coupled to outputs of the first and second waveguides. The MMI coupler merges light from the first and second waveguides to generate an interference pattern of light. The MMI coupler then outputs a plurality of phase shifted versions of the interference pattern. The wavelength locker also includes an interference pattern selector configured to receive signals corresponding, respectively, to light output from the outputs of the MMI coupler. The interference pattern selector is also configured to select one or more outputs of the MMI coupler based on power levels of the interference patterns output from the MMI coupler and a predetermined frequency of a telecommunications frequency grid.

Turning to the drawings, FIG. 1 illustrates an example structure 10 suitable for use as a wavelength locker or wavelength meter. The structure 10 is similar in form to a Mach Zehnder interferometer. The structure 10 comprises a multimode interference (MMI) coupler 110, an MMI coupler 112, waveguides 120 and 122, and a phase shifter 130. The structure 10 shown in FIG. 1 is provided as a representative example for discussion. Other arrangements of MMI couplers, waveguides, phase shifters, etc., can be relied upon as wavelength lockers and meters.

Referring to FIG. 1, the MMI coupler 110 can be embodied as a two (2) input, two (2) output (2×2) MMI coupler, and the MMI coupler 112 can also be embodied as a two (2) input, two (2) output (2×2) MMI coupler. In other cases, however, the MMI couplers 110 and 112 can be formed as 4×4 or 8×8 couplers, or couplers having any other suitable numbers of inputs and outputs. A first output of the MMI coupler 110 is coupled to an input end of the waveguide 120, and a second output of the MMI coupler 110 is coupled to an input end of the waveguide 122. A first input of the MMI coupler 112 is coupled to an output end of the waveguide 120, and a second input of the MMI coupler 112 is coupled to an output end of the waveguide 122.

The MMI couplers 110 and 112 can be embodied as passive components integrated in the structure 10. Light guided into the inputs of the MMI coupler 110 is allowed to propagate within and interfere with itself, constructively and/or destructively, within the MMI coupler 110. Based on the manner in which the light propagates and interferes with itself within the MMI coupler 110, a number of different interference patterns of output light are provided on the outputs of the MMI coupler 110. Similarly, light guided into the inputs of the MMI coupler 112 is allowed to propagate within and interfere with itself, constructively and/or destructively, within the MMI coupler 112. Based on the manner in which light interferes with itself within the MMI coupler 112, a number of different interference patterns of output light are provided on the outputs of the MMI coupler 112.

Optical waveguides are structures that guides electromagnetic waves in the optical spectrum (e.g., light). Optical fiber and rectangular waveguides are common types of waveguides and are used as the transmission medium in local and long haul optical communication systems and integrated optical circuits. Optical waveguides can be categorized according to their size, shape, and structure (e.g., planar, strip, or fiber waveguides), mode (e.g., single-mode, multi-mode), refractive index distribution (e.g., step or gradient index), and material (e.g., glass, polymer, semiconductor).

In the example shown in FIG. 1, the waveguide 120 can be formed as a rib waveguide, and the waveguide 122 can be formed as a wire waveguide. However, the waveguide 120 can be formed as a wire waveguide, and the waveguide 122 can be formed as a rib waveguide. In other cases, other types, forms, and/or structures of waveguides are within the scope of the embodiments, and the waveguides 120 and 122 can be formed as the same, similar, or different type(s) of waveguides.

The waveguide 120 has a refractive index n1 and a length L1, and the waveguide 122 has a refractive index n2 and a length L2. The refractive indices n1 and n2 depend upon a number of factors, including the materials from which the waveguides 120 and 122 are formed, the local temperature(s) of those materials, the dimensions of the waveguides 120 and 122, the type (e.g., rib-type or wire-type) the waveguides 120 and 122, the wavelength(s) of light travelling along the waveguides 120 and 122, and other factors. Because refractive indexes n1 and n2 and the lengths L1 and L2 can be different, the structure 10 can operate in part as an interferometer.

The phase shifter 130 is integrated along a length of the waveguide 122, but could be integrated along a length of the waveguide 120 in some cases. In one example case, the phase shifter 130 can be formed as a region of the waveguide 122 doped for resistivity, and the phase shifter 130 can heat a length of the waveguide 122. When heated, the refractive index n2 of the waveguide 122 changes (at least in the local region of the phase shifter 130), leading to a shift in phase (e.g., propagation delay) of light guided through the waveguide 122 as compared to when the waveguide 122 is not heated (and also as compared to the light guided through the waveguide 120). In other embodiments, the phase shifter 130 can alter the refractive index n2 of the waveguide 122 in other ways. For example, the phase shifter 130 can cause a phase shift or propagation delay for light guided through the waveguide 122 in other ways. For example, the phase shifter 130 can also cause a phase shift by imposing an electric field on the waveguide 122 or by injecting current into the waveguide 122.

To operate the structure 10 as a wavelength locker or meter, coherent light Li generated by one or more lasers, such as one or more Distributed Feedback (DFB) laser diodes, is provided to an input of the MMI coupler 110. After propagating through the MMI coupler 110, a portion Li1 of the light Li is provided to the waveguide 120 at the first output of the MMI coupler 110, and another portion Li2 of the light Li is provided to the waveguide 122 at the second output of the MMI coupler 110.

The light Li1 is guided along the waveguide 120 to a first input of the MMI coupler 112, and the light Li2 is guided along the waveguide 120, through the phase shifter 130, and to a second input of the MMI coupler 112. Because of the differences between the structures, refractive indexes n1 and n2, and the lengths L1 and L2 of the waveguides 120 and 122, respectively, the light Li1 can have a phase or group delay as compared to the light Li2 (or vice versa) when it reaches the MMI coupler 112. The light Li1 can also have other characteristic differences as compared to the light Li2. At the ends of the waveguides 120 and 122, the differences between the light Li1 and the light Li2 can be attributed to various factors, including but not limited to the wavelength of the light Li, differences between n1 and n2, differences between L1 and L2, and control of the phase shifter 130.

In the MMI coupler 112, the light Li1 interferes with the light Li2. As the light Li1 and the light Li2 are permitted to interfere with each other within the MMI coupler 112, the structure 10 operates in part as an interferometer. From the MMI coupler 112, light Lo1 is provided on a first output of the MMI coupler 112, and light Lo2 is provided on a second output of the MMI coupler 112. Both Lo1 and Lo2 can exhibit an interference pattern based on the manner in which the light Li1 and the light Li2 interfere with each other within the MMI coupler 112.

Based on the design of the structure 10, the power Po1 of the light Lo1 and the power Po2 of the light Lo2 are functions of the power Pi of the light Li, as follows:

$$P_{o1} = P_i \sin^2\left(\frac{\Delta\varphi}{2}\right) \text{ and} \qquad (1)$$

$$P_{o2} = P_i \cos^2\left(\frac{\Delta\varphi}{2}\right), \text{ where} \qquad (2)$$

$$\Delta\varphi = \frac{2\pi n_1 L_1}{\lambda} - \frac{2\pi n_2 L_2}{\lambda} \text{ and} \qquad (3)$$

λ is the wavelength of Li.

If the structure 10 were to operate in the athermal condition described by Equation (5) below, the relationship shown in Equation (6) should also be true.

$$\frac{\partial \Delta\varphi}{\partial T} = 0. \qquad (5)$$

$$L_1 \frac{\partial n_1}{\partial T} = L_2 \frac{\partial n_2}{\partial T}. \qquad (6)$$

Taken across a spectrum, the free spectral range (FSR) of both Lo1 and Lo2 is related to the spacing in optical frequency or wavelength between two successive optical intensity maxima or minima in Lo1 and Lo2. Based on the design of the structure 10, the FSR of Lo1 and Lo2 can be selected for use in grid channel monitoring and/or locking. For example, for an FSR of 100 GHz at a temperature of 40° Celsius, the length L1 of the waveguide 120 can be selected to be 22.43 mm, and the length L2 of the waveguide 122 can be selected to be 22.233 mm. Further, the waveguide 120 can be formed to have a thickness of 220 nm and width of 450 nm, and the waveguide 122 can be formed to have a thickness of 220 nm, an etch of 100 nm, and a width of 450 nm. For other FSRs, however, the structural characteristics of the waveguides 120 and 122 can vary.

Figure 2:
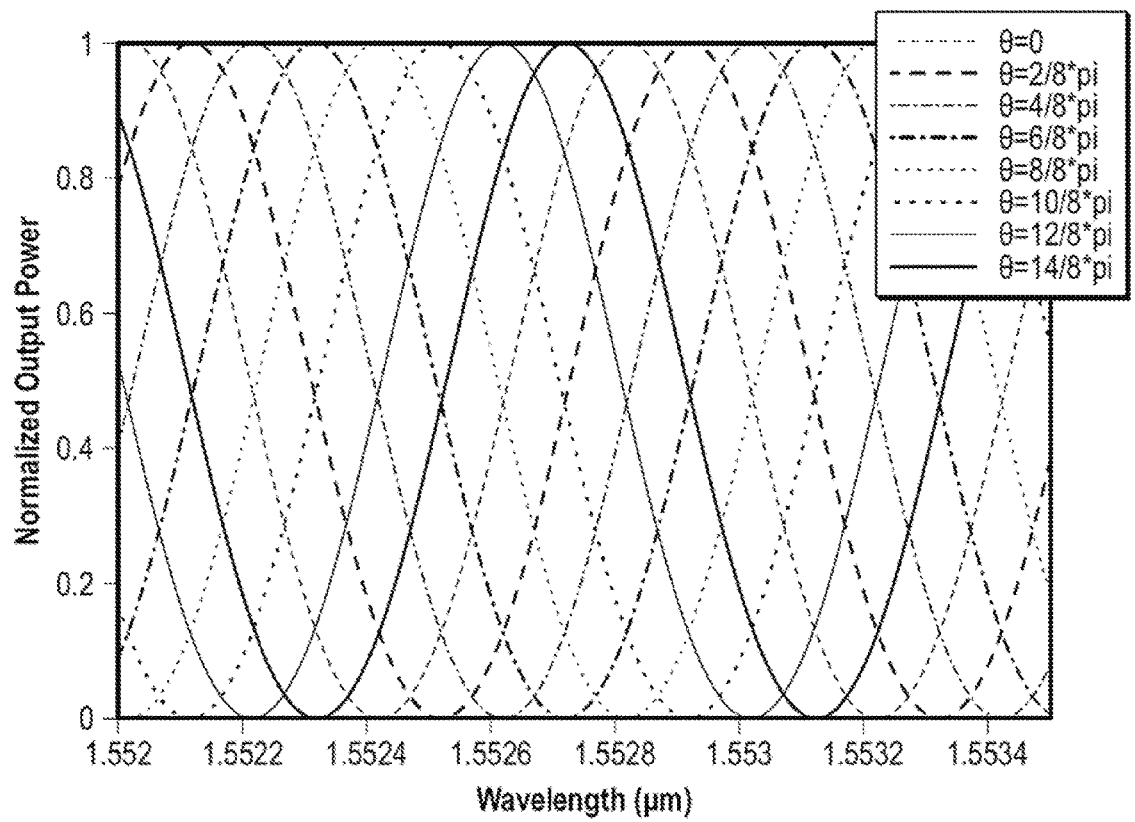
FIG. 2 illustrates a number of example outputs of the structure shown in FIG. 1, each shifted with respect to each other in phase, according to various embodiments described herein.

However, even when the structure 10 is designed for a certain FSR, it might be necessary to adjust the phase of the output of Lo1 and/or Lo2 for use in grid channel monitoring and/or locking. To that end, the phase shifter 130 can be controlled to impart a shift based on an adjustment of the characteristics of the waveguide 122. For example, a portion or length of the waveguide 122 can be heated (or not heated) to adjust the refractive index of the waveguide 122. The adjustment can lead to a phase shift of the output of Lo1 and/or Lo2. In that context, FIG. 2 illustrates a number of example outputs of Lo1, each shifted with respect to each other in phase. Depending upon the channel spacing grid for communications, the phase shifter 130 can be controlled to align Lo1 for sufficient output power at one or more wavelengths. To obtain a stable output of Lo1, however, can be necessary to maintain a closed-loop temperature-monitoring scheme and control loop to adjust the phase shifter 130 over time.

The materials used in SiPh devices can be particularly sensitive to temperature. Thus, it would be desirable to design SiPh wavelength locker and meter devices which reduce or eliminate the need for temperature-dependent phase shifters, temperature monitors, temperature controllers, etc. In other words, it would be desirable to design wavelength locker and meter devices which are athermal or thermally stable over a range from −40 C to 100 C, for example.

Figure 3:
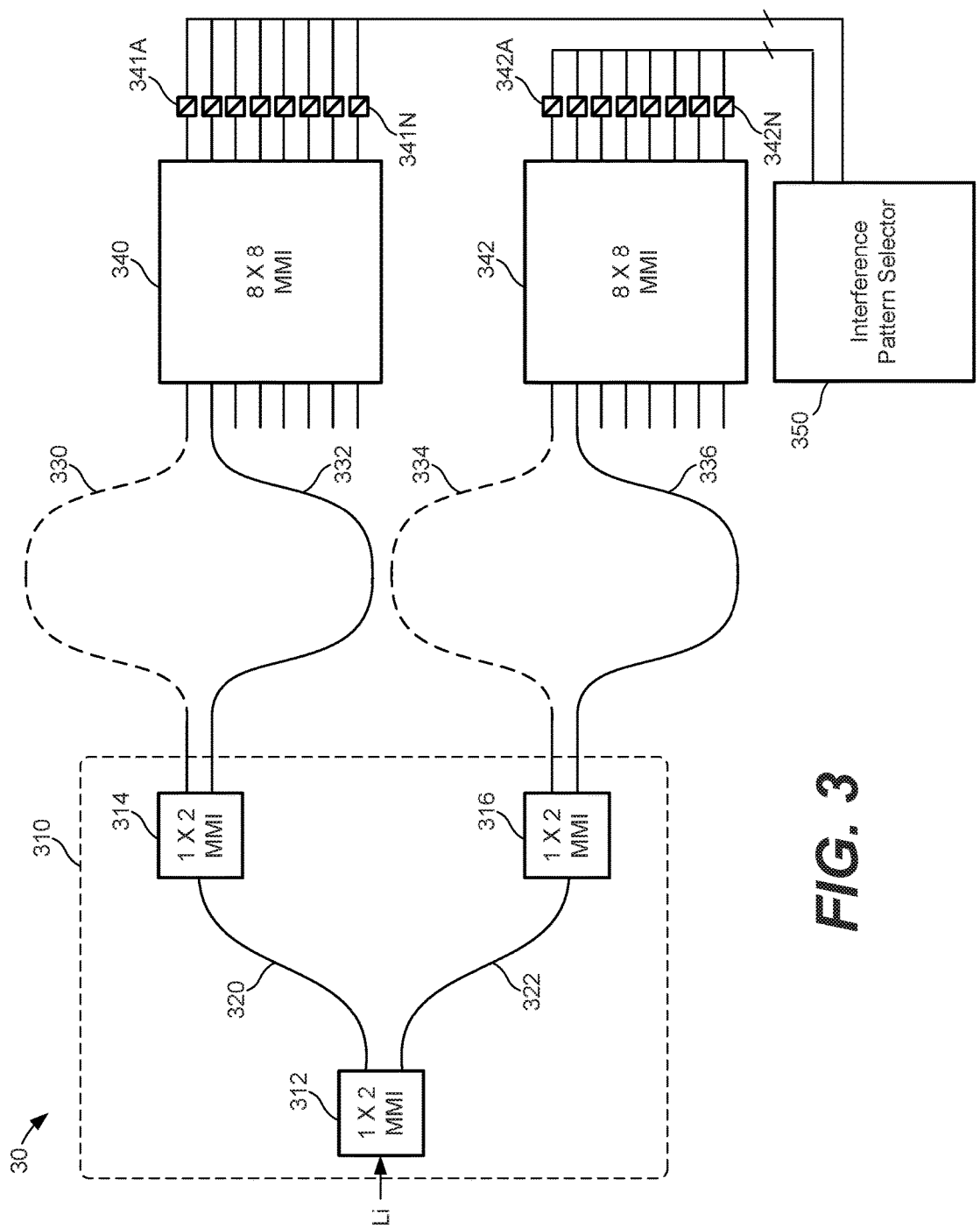
FIG. 3 illustrates an example structure suitable for use as a wavelength locker and wavelength meter according to various embodiments described herein.

In the context outlined above, FIG. 3 illustrates an example structure 30 suitable for implementation as an integrated SiPh device for use as a wavelength locker and wavelength meter. The structure 30 shown in FIG. 3 is provided as a representative example for discussion. Other arrangements of MMI couplers, waveguides, etc., that are consistent with the concepts described herein can be relied upon as an athermal wavelength locker and/or wavelength meters.

The structure 30 includes a one (1) input, four (4) output (1×4) MMI coupler 310. In the example shown in FIG. 3, the MMI coupler 310 includes MMI couplers 312, 314, and 316, each of which are one (1) input, two (2) output (1×2) couplers. However, in other cases, the MMI coupler 310 can be implemented as a single 1×4 coupler.

A first output of the MMI coupler 312 is provided to an input of the MMI coupler 314 over the waveguide 320, and a second output of the MMI coupler 312 is provided to an input of the MMI coupler 316 over the waveguide 322. The waveguides 320 and 322 can be formed as any suitable type(s) of waveguides.

As shown in FIG. 3, the structure 30 also includes MMI couplers 340 and 342, each of which is an eight (8) input, eight (8) output (8×8) coupler. The outputs of the MMI coupler 310 are provided as inputs to the MMI couplers 340 and 342. Particularly, the first output of the MMI coupler 314 is provided to the waveguide 330, which is coupled to a first input of the MMI coupler 340. Further, the second output of the MMI coupler 314 is provided to the waveguide 332, which is coupled to a second input of the MMI coupler 340. Additionally, the first output of the MMI coupler 316 is provided to the waveguide 334, which is coupled to a first input of the MMI coupler 342, and the second output of the MMI coupler 316 is provided to the waveguide 336, which is coupled to a second input of the MMI coupler 342. In one example case, the waveguides 330 and 334 can be formed as rib waveguides, and the waveguides 332 and 336 can be formed as wire waveguides.

The outputs of the MMI coupler 340 are fed into photodiodes 341A-341N, and the outputs of the MMI coupler 342 are fed into photodiodes 342A-342N. The photodiodes 341A-341N and 342A-342N can be embodied as light or laser photodiode sensors capable of measuring the output power of light emitted from the outputs of the MMI couplers 340 and 342. In that context, each of the photodiodes 341A-341N and 342A-342N can output an electric signal representative of the output power of light emitted from the outputs of the MMI couplers 340 and 342. The signals from the photodiodes 341A-341N and 342A-342N can be provided as a reference to an interference pattern selector 350 for closed loop control of the structure 30 as a wavelength locker and wavelength meter. In one embodiment, the photodiodes 341A-341N can be formed as Ge photodiodes, although other types of photodiodes can be used.

In operation, the light Li is divided or split four ways by the MMI coupler 310 and provided to the waveguides 330, 332, 334, and 336. Similar to the waveguides 120 and 122 shown in FIG. 2, each of the waveguides 330, 332, 334, and 336 is associated with a respective refractive index and length. Because those refractive indexes and lengths can vary as compared to each other, light guided down the waveguide 330 may experience a phase or propagation delay as compared to the light guided down the waveguide 332 (or vice versa). Similarly, light guided down the waveguide 334 may experience a phase or propagation delay as compared to the light guided down the waveguide 336 (or vice versa).

Light guided through the waveguides 330 and 332 and into the inputs of the MMI coupler 340 is allowed to interfere with itself, constructively and/or destructively, within the MMI coupler 340. Light guided from the waveguides 334 and 336 into the inputs of the MMI coupler 342 is also allowed to interfere with itself, constructively and/or destructively, within the MMI coupler 342. Based on the manner in which the light propagates and interferes with itself within the MMI coupler 340 (and the number of outputs ports of the MMI coupler 340), a number of different interference patterns of output light are provided on the outputs of the MMI coupler 340. A number of different interference patterns of output light are also provided on the outputs of the MMI coupler 342.

By design, each output of the MMI coupler 340 provides a phase-shifted interference pattern of light output based on light provided at one or more inputs to the MMI coupler 340. Likewise, each output of the MMI coupler 342 provides a phase-shifted interference pattern of light output based on light provided at one or more inputs to the MMI coupler 342. As described below, an interference pattern selector 350 selects a pair of outputs from the MMI coupler 340 and a pair of outputs from the MMI coupler 342. For additional granularity in the selection of an output having sufficient power at a particular frequency, one or both of the MMI couplers 340 and 342 can be implemented having additional inputs and outputs.

The interference pattern selector 350 can be embodied as a controller, including memory, implemented using one or more general purpose processing and/or application specific integrated circuits (ASICs) for controlling the operations of the structure 30. In some cases, as described below, the interference pattern selector 350 can be directed by software, firmware, or microcode.

Based on the signals from the photodiodes 341A-341N, the interference pattern selector 350 is configured to select one or more outputs of the MMI coupler 340 according to a channel spacing grid for optical communications. Similarly, based on the signals from the photodiodes 342A-342N, the interference pattern selector 350 can select one or more outputs of the MMI coupler 340 according to a channel spacing grid for optical communications. To that end, the structure 30 can be operated as a wavelength locker based on the selection of certain outputs from the MMI coupler 340. The structure 30 can also be operated as a wavelength meter based on the selection of certain outputs from the MMI coupler 342. The manner in which the interference pattern selector 350 selects certain outputs of the MMI couplers 340 and 342 is described in greater detail below with reference to FIGS. 4-7.

Because the refractive indexes and lengths of the waveguides 330, 332, 334, and 336 can be different, the structure 30 can operate in part as an interferometer. In that context, the FSR of the outputs of the MMI coupler 340 can be selected, in part, based on the refractive indexes and lengths of the waveguides 330 and 332, among other factors. In one example case, for an FSR of 100 GHz at a temperature of 40° Celsius, the length of the waveguide 330 can be selected to be 22.43 mm, and the length of the waveguide 332 can be selected to be 22.233 mm. Further, the waveguide 330 can be formed to have a thickness of 220 nm and width of 450 nm, and the waveguide 332 can be formed to have a thickness of 220 nm, an etch of 100 nm, and a width of 450 nm. For other FSRs, however, the structural characteristics of the waveguides 330 and 332 can vary.

Likewise, the FSR of the outputs of the MMI coupler 342 can be selected, in part, based on the refractive indexes and lengths of the waveguides 334 and 336, among other factors. In one example case, for an FSR of 1500 GHz at a temperature of 40° Celsius, the length of the waveguide 334 can be selected to be 150.96 um, and the length of the waveguide 336 can be selected to be 163.08 um. Further, the waveguide 334 can be formed to have a thickness of 220 nm and width of 450 nm, and the waveguide 336 can be formed to have a thickness of 220 nm, an etch of 100 nm, and a width of 450 nm. For other FSRs, however, the structural characteristics of the waveguides 334 and 336 can vary.

Figure 4:
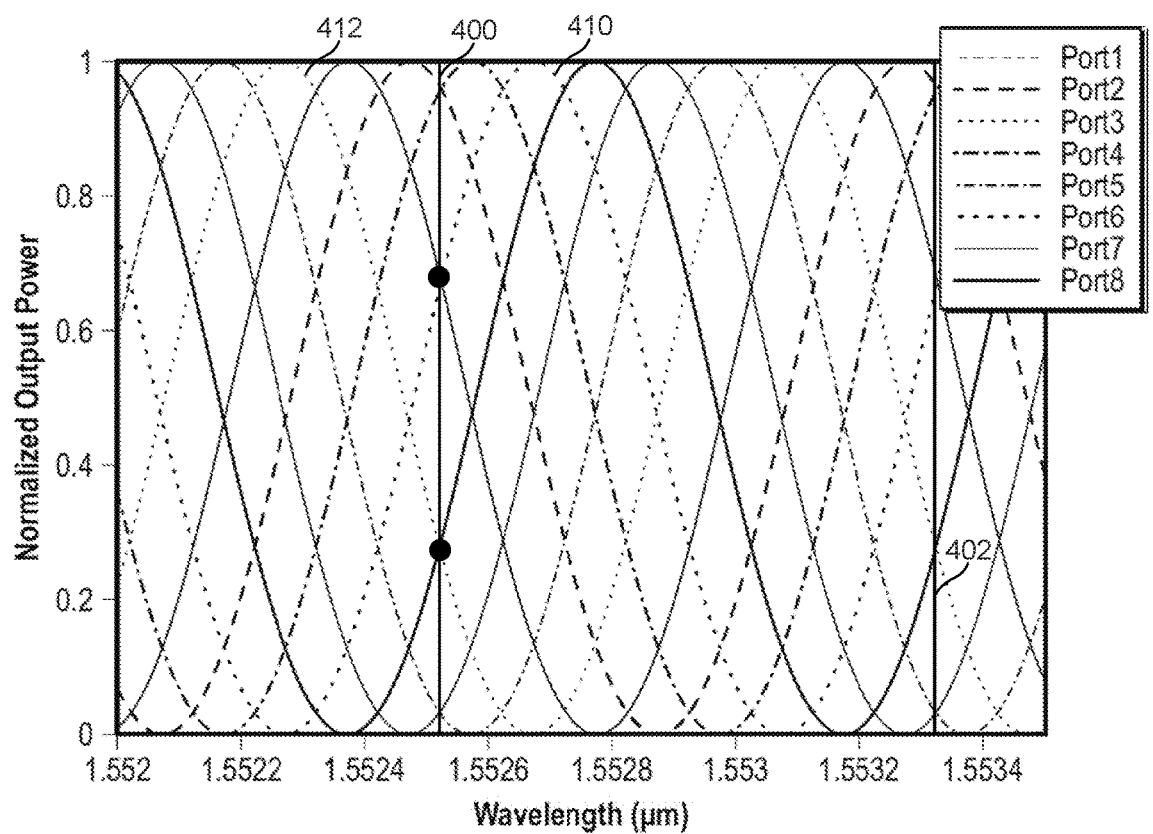
FIG. 4 illustrates example signal waveforms captured from outputs of the wavelength locker shown in FIG. 3 according to various embodiments described herein.

FIG. 4 illustrates example signal waveforms captured from different outputs or output ports of the wavelength locker shown in FIG. 3. Particularly, FIG. 4 illustrates example signal waveforms provided at outputs of the MMI coupler 340. As shown in FIG. 4, the signals are representative of a number of phase shifted versions of the interference pattern output by the MMI coupler 340, each one being provided on a separate output of the MMI coupler 340.

The interference pattern selector 350 receives the signals shown in FIG. 4 from the photodiodes 341A-341N and selects one or more of the signals having sufficient power at one or more wavelengths (or frequencies) according to a channel spacing grid for optical communications. As shown in FIG. 4, the wavelengths 400 and 402 are provided as example wavelengths that can be used on the 100 GHz ITU grid for optical communications. As also shown, the output signals 410 and 412 (from output ports 3 and 6 of the MMI coupler 340) are the only supplementary (e.g., phase shifted by the predetermined shift of 180°) pair of output signals which both have sufficient normalized output power at the wavelengths 400 and 402. Thus, the interference pattern selector 350 can identify the signals provided on output ports 3 and 5 of the MMI coupler 340 for use.

Figure 5:
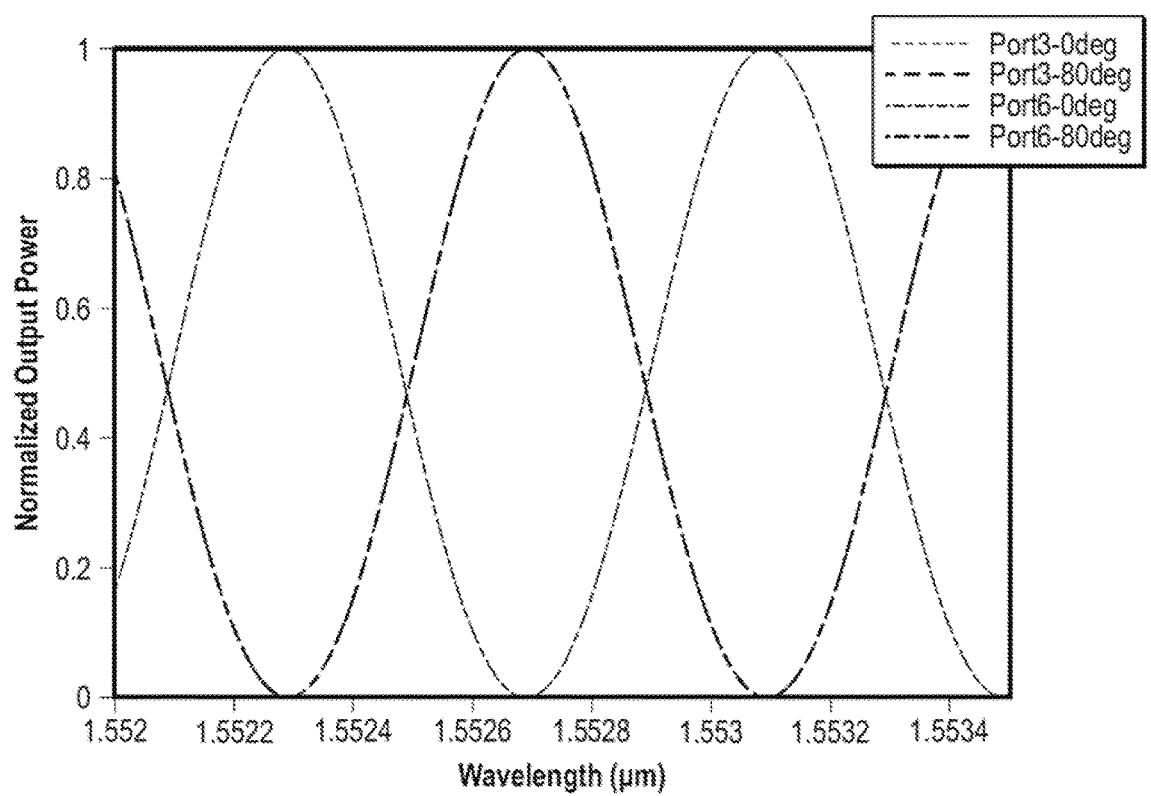
FIG. 5 illustrates signal waveforms to demonstrate the athermal operating characteristics of the wavelength locker shown in FIG. 3 according to various embodiments described herein.

FIG. 5 illustrates signal waveforms to demonstrate the athermal operating characteristics of the wavelength locker shown in FIG. 3 according to various embodiments described herein. Particularly, for the outputs from the MMI coupler 340 on ports 3 and 6, FIG. 5 shows the signals output at temperatures of 0° and 80° Celsius. As can be seen, the signals at 0° Celsius are not shifted in phase as compared to those at 80° Celsius. Thus, FIG. 5 demonstrates the athermal characteristics of the structure 30 shown in FIG. 3.

Figure 6:
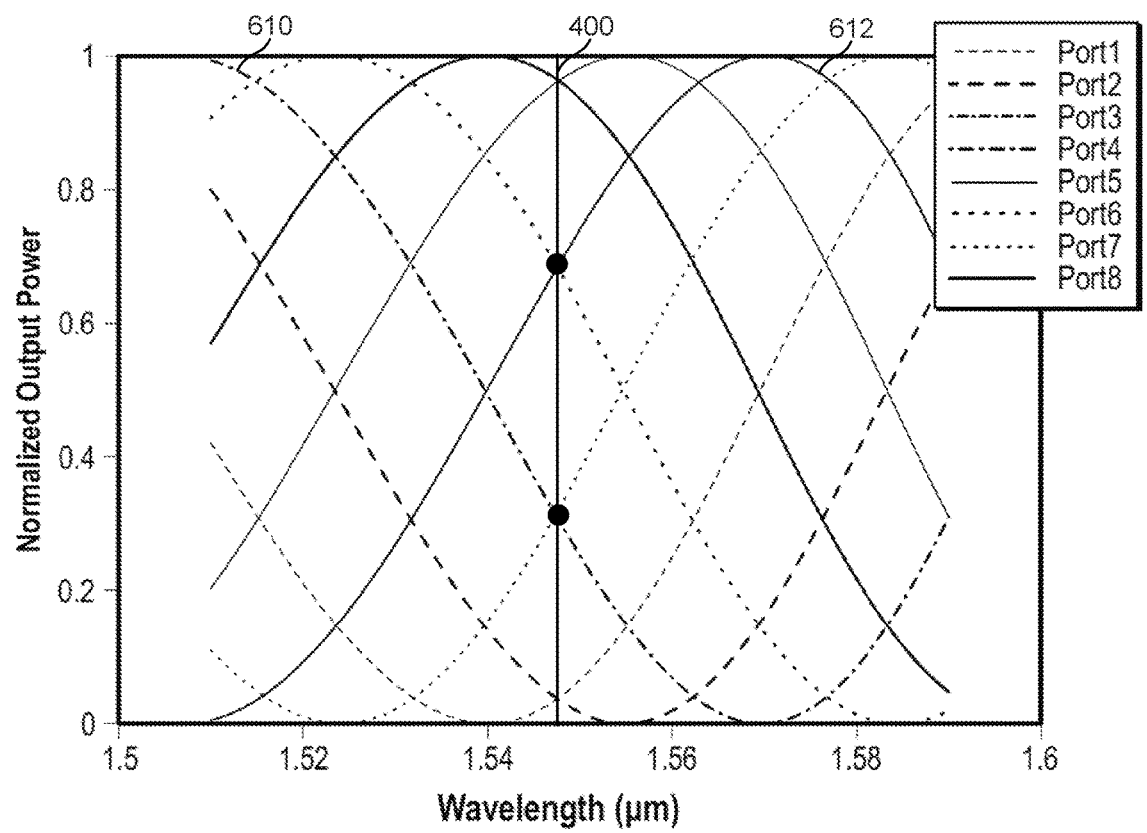
FIG. 6 illustrates example signal waveforms captured from outputs of the wavelength meter shown in FIG. 3 according to various embodiments described herein.

FIG. 6 illustrates example signal waveforms captured from different outputs or output ports of the wavelength meter shown in FIG. 3. Particularly, FIG. 6 illustrates example signal waveforms provided at outputs of the MMI coupler 342. As shown in FIG. 6, the signals are representative of a number of phase shifted versions of the interference pattern output by the MMI coupler 342, each one being provided on a separate output of the MMI coupler 342.

The interference pattern selector 350 receives the signals shown in FIG. 6 from the photodiodes 342A-342N and selects one or more of the signals having sufficient power at one or more wavelengths (or frequencies) according to a channel spacing grid for optical communications. As shown in FIG. 6, the wavelength 400 is provided as an example wavelength that can be used on the 100 GHz ITU grid for optical communications. As also shown, the output signals 610 and 612 (from output ports 4 and 5 of the MMI coupler 342) are the only supplementary (e.g., phase shifted by the predetermined shift of 180°) pair of output signals which both have sufficient normalized output power at the wavelength 400. Thus, the interference pattern selector 350 can identify the signals provided on output ports 4 and 5 of the MMI coupler 342 for use.

Figure 7:
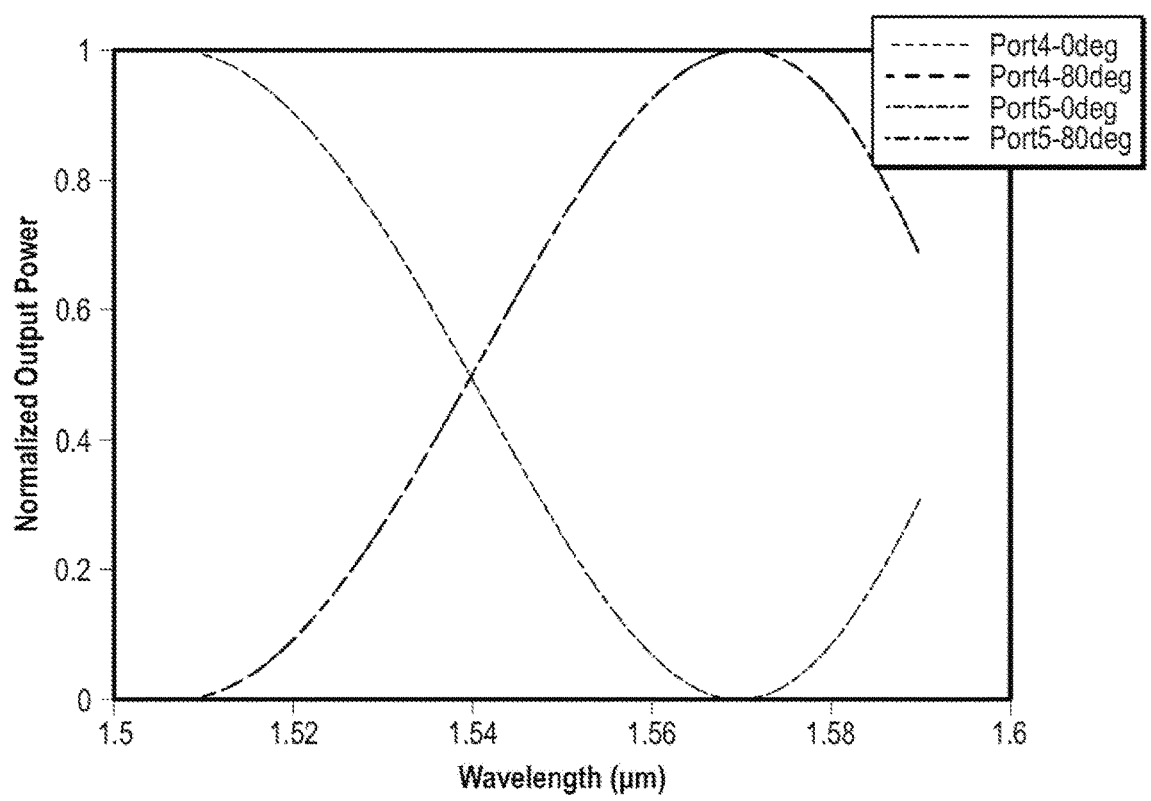
FIG. 7 illustrates signal waveforms to demonstrate the athermal operating characteristics of the wavelength meter shown in FIG. 3 according to various embodiments described herein.

FIG. 7 illustrates signal waveforms to demonstrate the athermal operating characteristics of the wavelength locker shown in FIG. 7 according to various embodiments described herein. Particularly, for the outputs from the MMI coupler 342 on ports 4 and 5, FIG. 7 shows the signals output at temperatures of 0° and 80° Celsius. As can be seen, the signals at 0° Celsius are not shifted in phase as compared to those at 80° Celsius. Thus, FIG. 7 demonstrates the athermal characteristics of the structure 30 shown in FIG. 3.

Figure 8:
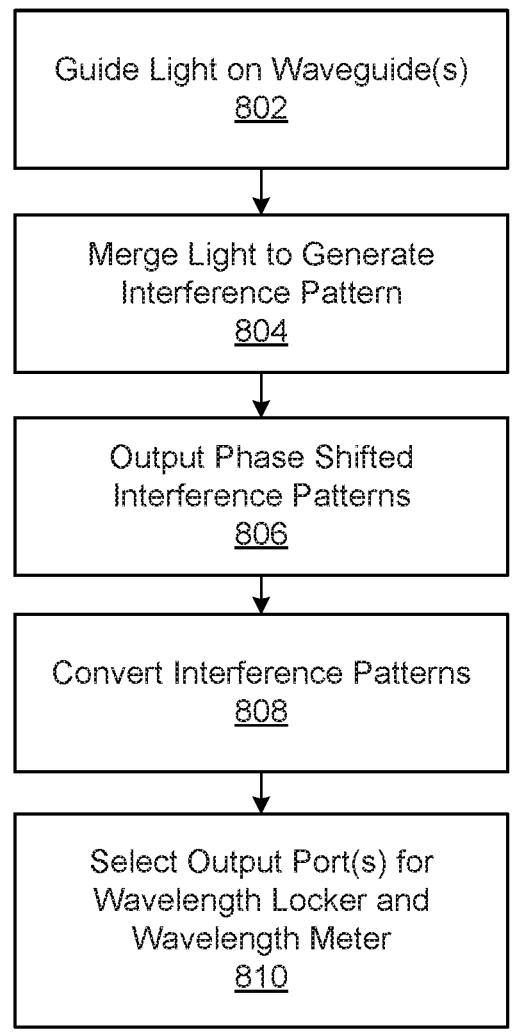
FIG. 8 illustrates an example process of an athermal wavelength locker and meter according to various embodiments described herein.

FIG. 8 illustrates an example process of an athermal wavelength locker and meter according to various embodiments described herein. The process diagram shown in FIG. 8 provides one example of a sequence of steps according to the concepts described herein. The arrangement of the steps shown in FIG. 8 is provided by way of representative example. In other embodiments, the order of the steps can differ from that depicted. For example, an order of execution of two or more of the steps can be scrambled relative to the order shown. Also, in some cases, two or more of the steps can be performed concurrently or with partial concurrence. Further, in some cases, one or more of the steps can be skipped or omitted. Additionally, although the process is described in connection with the structure 30 shown in FIG. 3, other structures can be used to perform the process.

At step 802, the process includes guiding light along a first waveguide and guiding light along a second waveguide. With reference to FIG. 3 for an example, the light Li can be split by the MMI 310 and provided as inputs to the waveguides 330 and 332, where the waveguide 330 is a rib waveguide and the waveguide 332 is a wire waveguide. One or both of the waveguides 330 and 332 can introduce a propagation delay on the light. Further, the light Li can be split by the MMI 310 and provided as inputs to the waveguides 334 and 336, where the waveguide 334 is a rib waveguide and the waveguide 336 is a wire waveguide. One or both of the waveguides 334 and 336 can also introduce a propagation delay on the light.

At step 804, the process includes merging the light guided along the first and second waveguides from step 802, to generate an interference pattern of the light. For example, light guided through the waveguides 330 and 332 and into the inputs of the MMI coupler 340 is allowed to interfere with itself, constructively and/or destructively, within the MMI coupler 340. Further, light guided from the waveguides 334 and 336 into the inputs of the MMI coupler 342 is also allowed to interfere with itself, constructively and/or destructively, within the MMI coupler 342.

At step 806, the process includes outputting, from outputs of the MMI coupler 340, a number of phase shifted versions of the interference pattern from the MMI coupler 340. Additionally, the process includes outputting, from outputs of the MMI coupler 342, a number of phase shifted versions of the interference pattern from the MMI coupler 342.

At step 808, the process includes converting, by the photodiodes 341A-341N, the optical interference pattern outputs from the MMI coupler 340 into a number of electrical signals for processing by the interference pattern selector 350. The process also includes converting, by the photodiodes 342A-342N, the optical interference pattern outputs from the MMI coupler 342 into a number of electrical signals by the interference pattern selector 350.

At step 810, the process includes selecting, by the interference pattern selector 350, at least one of the outputs of the MMI coupler 340 and at least one of the outputs of the MMI coupler 342. In some cases, the interference pattern selector 350 can select a pair of outputs from each of the MMI couplers 340 and 342. The interference pattern selector 350 can select the outputs based on a predetermined frequency or channel spacing of a telecommunications frequency grid. More particularly, the interference pattern selector 350 can select the outputs of the MMI couplers 340 and 342 based on which signals corresponding to those outputs have sufficient power at one or more wavelengths (or frequencies) according to the relevant channel spacing.

In the example shown in FIG. 4, for example, the outputs can be selected for the 100 GHz ITU grid for optical communications. As shown in FIG. 4, the output signals 410 and 412 (from output ports 3 and 6 of the MMI coupler 340) are the only supplementary (e.g., phase shifted by the predetermined shift of 180°) pair of output signals which both have sufficient normalized output power at the wavelengths 400 and 402. Thus, the interference pattern selector 350 can identify the signals provided on output ports 3 and 5 of the MMI coupler 340 for use. Further, as shown in FIG. 6, the output signals 610 and 612 (from output ports 4 and 5 of the MMI coupler 342) are the only supplementary pair of output signals which both have sufficient normalized output power at the wavelength 400. Thus, the interference pattern selector 350 can identify the signals provided on output ports 4 and 5 of the MMI coupler 342 for use.

The interference pattern selector 350 can include at least one processing circuit and at least one memory or memory device. The processing circuit can include one or more processors and be coupled to the memory device via a local interface. The memory can store computer-readable instructions executable by one or processors of the processing circuit. Thus, interference pattern selector 350 can be embodied in the form of hardware, as software components that are executable by hardware, or as a combination of software and hardware.

If embodied as hardware, the interference pattern selector 350 can be implemented as a circuit or state machine that employs any suitable hardware technology. The hardware technology can include one or more processors or microprocessors, discrete logic circuits having logic gates for implementing various logic functions upon an application of one or more data signals, ASICs having appropriate logic gates, programmable logic devices (e.g., field-programmable gate array (FPGAs), complex programmable logic devices (CPLDs), etc.).

Also, one or more or more of the components described herein that includes software or program instructions can be embodied in any non-transitory computer-readable medium for use by or in connection with an instruction execution system such as a processor in a computer system or other system. The computer-readable medium can contain, store, or maintain the software or program instructions for use by or in connection with the instruction execution system.

The computer-readable medium can include physical media, such as, magnetic, optical, semiconductor, or other suitable media. Examples of a suitable computer-readable media include, but are not limited to, solid-state drives, magnetic drives, flash memory. Further, any logic or component described herein can be implemented and structured in a variety of ways.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A wavelength locker, comprising:
   a first multimode interference (MMI) coupler, at least one input of the first MMI coupler being coupled to a coherent source of light;
   a first waveguide having an input coupled to a first output of the first MMI coupler;
   a second waveguide having an input coupled to a second output of the first MMI coupler;
   a second MMI coupler having a plurality of inputs and a plurality of outputs, a first of the plurality of inputs of the second MMI coupler being coupled to an output of the first waveguide, and a second of the plurality of inputs of the second MMI coupler being coupled to an output of the second waveguide; and
   an interference pattern selector configured to:
      receive a plurality of signals corresponding, respectively, to light output from the plurality of outputs of the second MMI coupler, the plurality of outputs of the second MMI coupler comprising at least three outputs; and
      select a pair of the plurality of outputs of the second MMI coupler based on power levels of individual ones of the plurality of outputs and a predetermined frequency of a telecommunications frequency grid.

2. The wavelength locker according to claim 1, wherein the interference pattern selector is configured to select the pair of the plurality of outputs based on the predetermined frequency of the telecommunications frequency grid and a predetermined phase shift.

3. The wavelength locker according to claim 2, wherein the predetermined phase shift is about 180 degrees.

4. The wavelength locker according to claim 1, wherein the first waveguide comprises a rib waveguide having a first length and the second waveguide comprises a wire waveguide having a second length.

5. The wavelength locker according to claim 4, wherein the first length is greater than the second length.

6. The wavelength locker according to claim 1, wherein the first waveguide, the second waveguide, and the second MMI coupler operate as an interferometer at a free spectral range based on the telecommunications frequency grid.

7. The wavelength locker according to claim 1, further comprising a plurality of photodetectors configured to convert the light output from the plurality of outputs of the second MMI coupler to the plurality of signals for the interference pattern selector.

8. The wavelength locker according to claim 1, further comprising:
   a third waveguide having an input coupled to a third output of the first MMI coupler;
   a fourth waveguide having an input coupled to a fourth output of the first MMI coupler; and
   a third MMI coupler having a plurality of inputs and a plurality of outputs, a first of the plurality of inputs of the third MMI coupler being coupled to an output of the third waveguide, and a second of the plurality of inputs of the third MMI coupler being coupled to an output of the fourth waveguide.

9. The wavelength locker according to claim 8, wherein the interference pattern selector is further configured to:
   receive a plurality of signals corresponding, respectively, to light output from a plurality of outputs of the third MMI coupler; and
   select a pair of the plurality of outputs of the third MMI coupler based on another predetermined frequency of a telecommunications frequency grid.

10. A method of wavelength locking, comprising:
    guiding light along a first waveguide;
    guiding light along a second waveguide, at least one of the first waveguide or the second waveguide introducing a propagation delay;
    merging the light from the first waveguide with the light from the second waveguide in a multimode interference (MMI) coupler to generate an interference pattern of light;
    outputting, from a plurality of outputs of the MMI coupler, a plurality of phase shifted versions of the interference pattern, the plurality of outputs of the MMI coupler comprising at least three outputs;
    converting the plurality of phase shifted versions of the interference pattern into a plurality of signals; and
    selecting, by a processing circuit, a pair of the plurality of outputs of the MMI coupler based on power levels of individual ones of the plurality of outputs of the MMI coupler and a predetermined frequency of a telecommunications frequency grid.

11. The method of wavelength locking according to claim 10, wherein the first waveguide comprises a rib waveguide having a first length and the second waveguide comprises a wire waveguide having a second length.

12. The method of wavelength locking according to claim 11, wherein the first waveguide, the second waveguide, and the MMI coupler operate as an interferometer at a free spectral range based on the telecommunications frequency grid.

13. A wavelength locker, comprising:
    a first waveguide to guide light;
    a second waveguide to guide light, at least one of the first waveguide or the second waveguide introducing a propagation delay;
    a multimode interference (MMI) coupler having a plurality of inputs and a plurality of outputs, a first of the plurality of inputs being coupled to an output of the first waveguide, and a second of the plurality of inputs being coupled to an output of the second waveguide, the plurality of outputs of the MMI coupler comprising at least three outputs; and
    an interference pattern selector configured to:
       receive a plurality of signals corresponding, respectively, to light output from a plurality of outputs of the MMI coupler; and
       select a pair of the plurality of outputs of the MMI coupler based on power levels of individual ones of the plurality of outputs and a predetermined frequency of a telecommunications frequency grid.

14. The wavelength locker according to claim 13, wherein the first waveguide comprises a rib waveguide having a first length, the second waveguide comprises a wire waveguide having a second length, and the first length is greater than the second length.

15. The wavelength locker according to claim 13, wherein the first waveguide, the second waveguide, and the MMI coupler operate as an interferometer at a free spectral range based on the telecommunications frequency grid.

16. The wavelength locker according to claim 13, further comprising a plurality of photodetectors configured to convert the light output from the plurality of outputs of the second MMI coupler to the plurality of signals for the interference pattern selector.

* * * * *